(12) United States Patent
Tsuchido et al.

(10) Patent No.: US 7,732,995 B2
(45) Date of Patent: Jun. 8, 2010

(54) PIEZOELECTRIC DEVICE AND METHOD FOR MANUFACTURING THE SAME

(75) Inventors: Kenji Tsuchido, Minowa-machi (JP); Takahiro Kuroda, Minowa-machi (JP)

(73) Assignee: Epson Toyocom Corporation, Tokyo (JP)

( * ) Notice: Subject to any disclaimer, the term of this patent is extended or adjusted under 35 U.S.C. 154(b) by 0 days.

(21) Appl. No.: 12/201,757

(22) Filed: Aug. 29, 2008

(65) Prior Publication Data

US 2009/0066191 A1 Mar. 12, 2009

(30) Foreign Application Priority Data

Sep. 7, 2007 (JP) .............................. 2007-232805

(51) Int. Cl.
*H01L 41/053* (2006.01)
(52) U.S. Cl. .................... 310/348; 310/349; 310/351; 310/365
(58) Field of Classification Search ................ 310/320, 310/348, 349, 351, 365
See application file for complete search history.

(56) References Cited

U.S. PATENT DOCUMENTS 2,676,275 A * 4/1954 Bigler ........................ 310/355
2004/0174092 A1 * 9/2004 Iwata ........................ 310/324
2006/0192460 A1 * 8/2006 Tanaka ....................... 310/333
2009/0153257 A1 * 6/2009 Matsuo ...................... 331/116 R

FOREIGN PATENT DOCUMENTS

| GB | 2 202 989 A | * 10/1988 | |
| JP | 62-150188 | * 7/1987 | ................. 310/365 |
| JP | A-2006-94372 | 4/2006 | |
| JP | 2006-254210 | * 9/2006 | |

* cited by examiner

*Primary Examiner*—Thomas M Dougherty
(74) *Attorney, Agent, or Firm*—Oliff & Berridge, PLC

(57) ABSTRACT

A piezoelectric device includes: a lower substrate; an upper substrate; an intermediate substrate sandwiched between the lower substrate and the upper substrate, the intermediate substrate including: a piezoelectric vibrating portion; a frame surrounding a periphery of the piezoelectric vibrating portion; a connecting portion coupling the piezoelectric vibrating portion and the frame; a first exciting electrode disposed on an upper surface of the piezoelectric vibrating portion; a second exciting electrode disposed on a lower surface of the piezoelectric vibrating portion; a first wiring line electrically coupled to the first exciting electrode; and a second wiring line electrically coupled to the second exciting electrode; and an inside surface coupling an upper surface and a lower surface of the frame and having a slanted surface having an interior angle with respect to one of the upper surface and the lower surface, the angle being 90 degrees or more. In the oscillator, one of the first wiring line and the second wiring line is disposed to a surface of the slanted surface.

5 Claims, 5 Drawing Sheets

PIEZOELECTRIC DEVICE AND METHOD FOR MANUFACTURING THE SAME

BACKGROUND

1. Technical Field

The present invention relates to a piezoelectric device and a method for manufacturing the same.

2. Related Art

Recently, piezoelectric devices such as quartz crystal resonators are required to be more downsized with the miniaturization of electronic apparatuses. As a technique to realize the miniaturization of elements, JP-A-2006-94372 discloses a technique in which a quartz crystal substrate having a quartz crystal resonator is sandwiched and bonded together with two substrates having the same shape of that of the quartz crystal substrate so as to be sealed.

By using this technique, a quartz crystal substrate including a plurality of quartz crystal resonators is sandwiched and bonded with two substrates. Then, the bonded substrates are cut so as to provide a plurality of small piezoelectric devices. As a result, the number of processes can be reduced.

SUMMARY

An advantage of the invention is to provide a piezoelectric device that can be further downsized and a method for manufacturing the same.

According to a first aspect of the invention, a piezoelectric device includes a lower substrate, an upper substrate, and an intermediate substrate sandwiched between the lower substrate and the upper substrate, the intermediate substrate including: a piezoelectric vibrating portion; a frame surrounding a periphery of the piezoelectric vibrating portion; a connecting portion coupling the piezoelectric vibrating portion and the frame; a first exciting electrode disposed on an upper surface of the piezoelectric vibrating portion; a second exciting electrode disposed on a lower surface of the piezoelectric vibrating portion; a first wiring line electrically coupled to the first exciting electrode; and a second wiring line electrically coupled to the second exciting electrode; and an inside surface that couples an upper surface and a lower surface of the frame and has a slanted surface having an interior angle with respect to the upper surface or the lower surface, the angle being 90 degrees or more. In the oscillator, the first wiring line or the second wiring line is disposed to a surface of the slanted surface.

In the device, the frame may have a first recess that is disposed to the lower surface and communicates from an inside to an outside of the frame, and the first wiring line may extend in the first recess.

In the device, the frame may have a second recess that is disposed to the lower surface so as to face the first recess and communicates from the inside to the outside of the frame, and the second wiring line may extend in the second recess.

In the device, the first slanted surface may be formed in two steps, and the first wiring line may be formed both to the steps of the slanted surface.

In the device, the inside surface of the frame may have a first slanted surface having a first interior angle with respect to the upper surface of the frame, the first interior angle being 90 degrees or more, and a second slanted surface may have a second interior angle with respect to the lower surface of the frame, the second interior angle being 90 degrees or more, and the first wiring line may extend both to the first slanted surface and the second slanted surface.

According to a second aspect of the invention, a method for manufacturing a piezoelectric device including a lower substrate, an upper substrate, and an intermediate substrate sandwiched between the lower substrate and the upper substrate includes: (a) preparing the intermediate substrate including: a piezoelectric vibrating portion; a frame surrounding a periphery of the piezoelectric vibrating portion; a connecting portion coupling the piezoelectric vibrating portion and the frame; a first exciting electrode disposed on an upper surface of the piezoelectric vibrating portion; a second exciting electrode disposed on a lower surface of the piezoelectric vibrating portion; a first wiring line electrically coupled to the first exciting electrode; a second wiring line electrically coupled to the second exciting electrode; and a first recess and a second recess both of which are disposed to the lower surface of the frame and communicate from an inside to an outside of the frame; (b) contacting a pair of probes with the first wiring line and the second wiring line so as to adjust a vibration frequency of the piezoelectric vibrating portion; and (c) bonding the upper substrate, the lower substrate and the intermediate substrate. In the step (a), the first wiring line extends in the first recess and the second wiring line extends in the second recess. In the step (b), one of the pair of the probes is contacted with the first wiring line in the first recess, and the other of the pair of the probes is contacted with the second wiring line in the second recess.

In the method, in the step (a), the intermediate substrate may have: a plurality of the piezoelectric vibrating portions arranged in a substrate surface direction; a plurality of the first exciting electrodes; a plurality of the second exciting electrodes; a plurality of the first wiring lines; a plurality of the second wiring lines; a plurality of the first recesses; and a plurality of the second recesses, and at least one of the plurality of the first recesses, and at least one of the second recesses may be disposed to the frame, the frame having at least a first frame and a second frame adjacent to the first frame, the first recess disposed to the first frame having a communication portion communicating with the second recess disposed to the second frame, and the lower substrate may have a plurality of through holes. In the step (c), the lower substrate and the intermediate substrate may be bonded so that each of the plurality of through holes overlaps the communication portion. After the step (c), the method may further include: plugging a conductive material into the through holes; and cutting and separating the upper substrate, the intermediate substrate, and the lower substrate along a cutting line disposed to a region having the through holes.

BRIEF DESCRIPTION OF THE DRAWINGS

The invention will be described with reference to the accompanying drawings, wherein like numbers reference like elements.

DESCRIPTION OF EXEMPLARY EMBODIMENTS

1. Piezoelectric Device

Figure 1A:
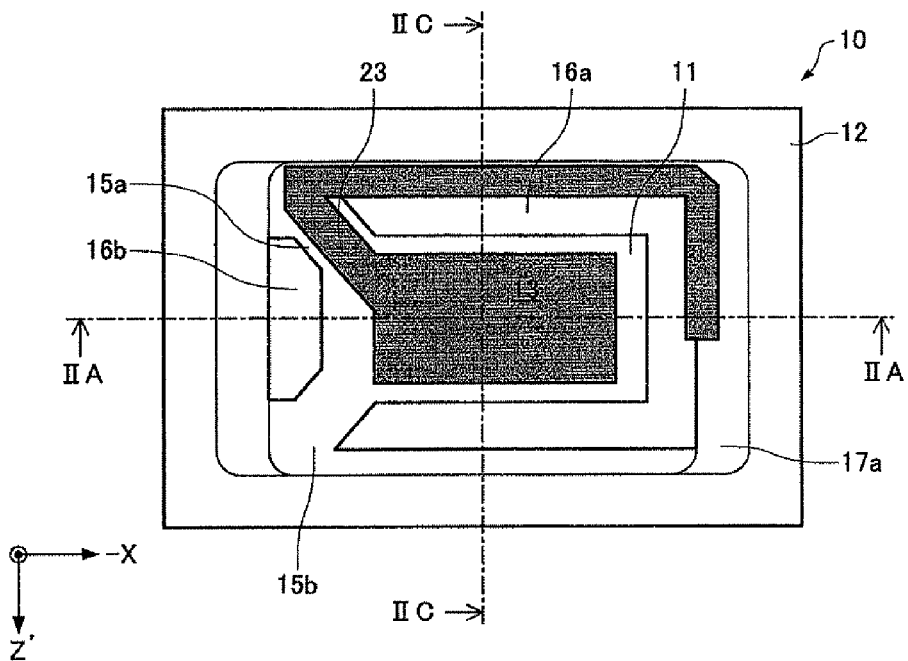
FIG. 1A is a top view illustrating an intermediate substrates included in a piezoelectric device according to an embodiment of the invention.
Figure 1B:
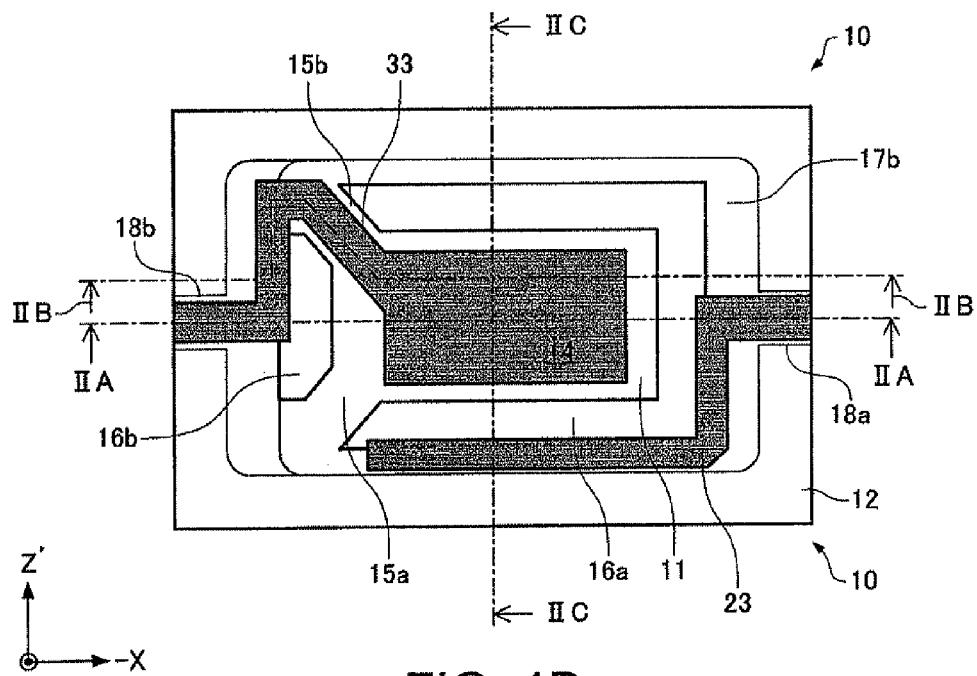
FIG. 1B is a bottom view illustrating the intermediate substrates included in the piezoelectric device according to the embodiment.
Figure 2A:
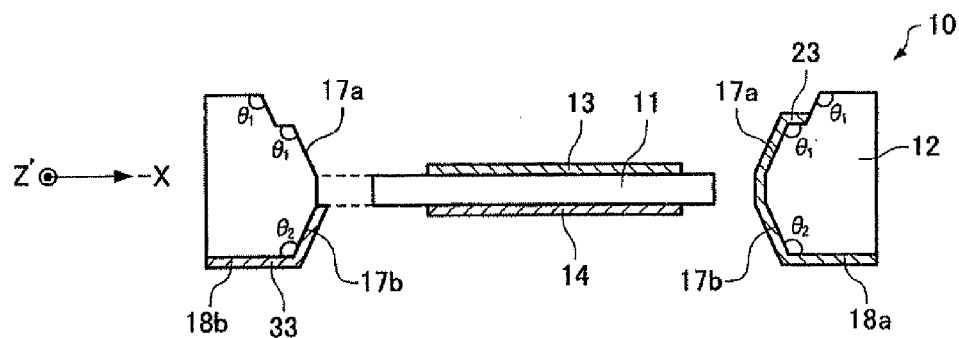
FIGS. 2A, 2B, and 2C are a sectional views illustrating the intermediate substrate of the embodiment.
Figure 2B:
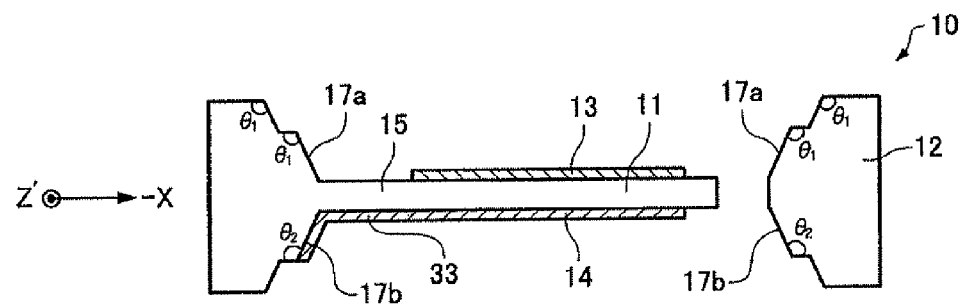
Figure 2C:
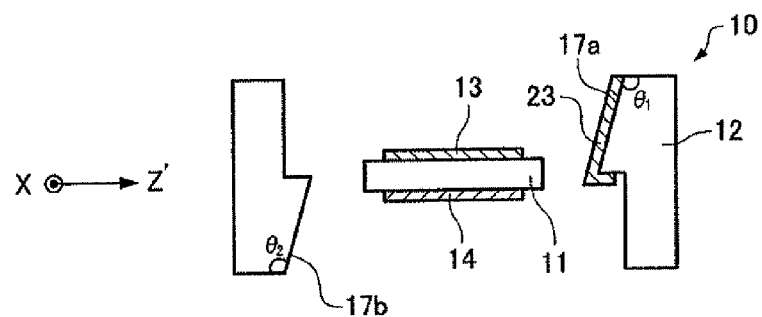
Figure 3:
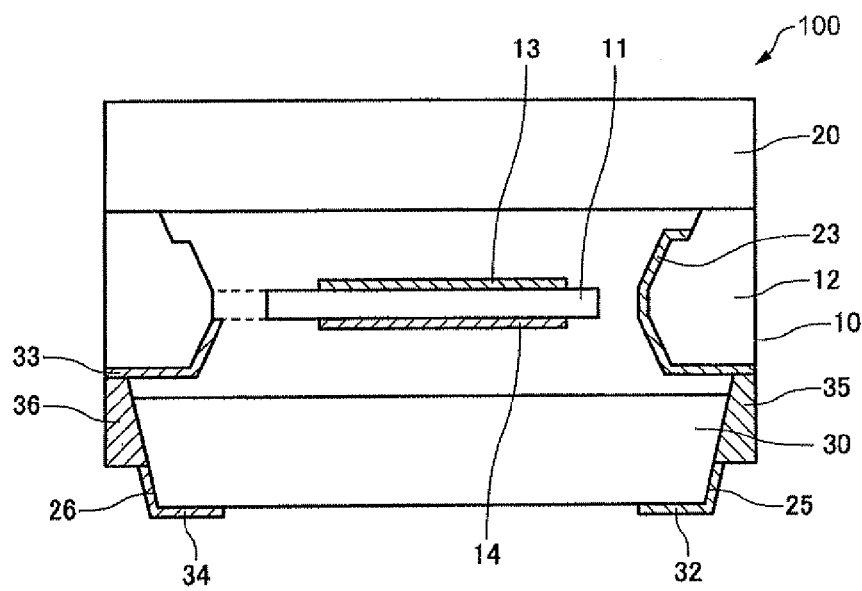
FIG. 3 is a sectional view illustrating the piezoelectric device of the embodiment.

FIG. 1A is a top view of an intermediate substrate used in a piezoelectric device according to an embodiment of the invention. FIG. 1B is a bottom view of the same. FIGS. 2A to 2C are sectional views of the same. FIG. 3 is a sectional view of the piezoelectric device of the embodiment taken along the line II(A)-II(A) in FIGS. 1A and 1B.

A piezoelectric device 100 of the embodiment includes a lower substrate 30, an upper substrate 20, and an intermediate substrate 10 sandwiched between the lower substrate 30 and the upper substrate 20. As shown in FIG. 3, the lower substrate 30 and the upper substrate 20 sandwich the intermediate substrate 10, so that a piezoelectric vibrating portion 11 disposed to the intermediate substrate 10 can be sealed.

1.1 Intermediate Substrate

FIG. 1A is a top view schematically shows the intermediate substrate 10. FIG. 1B is a bottom view schematically shows the same. FIGS. 2A to 2C are sectional views schematically show the same. FIG. 2A is a sectional view taken along the line II(A)-II(A) in FIGS. 1A and 1B. FIG. 2B is a sectional view taken along the line II(B)-II(B) in FIGS. 1A and 1B. FIG. 2C is a sectional view taken along the line II(C)-II(C) in FIGS. 1A and 1B.

The intermediate substrate 10 includes a piezoelectric vibrating portion 11, a frame 12 surrounding the periphery of the piezoelectric vibrating portion 11, connecting portions 15a and 15b connecting the piezoelectric vibrating portion 11 and the frame 12, a first exciting electrode 13 disposed on the upper surface of the piezoelectric vibrating portion 11, a second exciting electrode 14 disposed on the lower surface of the piezoelectric vibrating portion 11, a first wiring line 23 electrically connected to the first exciting electrode 13, and a second wiring line 33 electrically connected to the second exciting electrode 14.

The intermediate substrate 10 has a slit 16a having a C-shape so that a region excluding the connecting portions 15a and 15b does not make contact with the piezoelectric vibrating portion 11. In the intermediate substrate 10, a region inside the slit 16a functions as the piezoelectric vibrating portion 11 while a region outside the slit 16a functions as the frame 12 to bond the upper substrate 20 and the lower substrate 30. In addition, the slit 16b is disposed between the connecting portions 15a and 15b. The piezoelectric vibrating portion 11 having two ends in parallel with the Z'-axis is supported at only one end thereof.

The intermediate substrate 10 has a step structure and slanted surfaces. Specifically, as shown in FIGS. 2A to 2C, a region outside the frame 12 is the thickest in an up-and-down direction (perpendicular to the X-axis direction) while the region of the piezoelectric vibrating portion 11 is the thinnest. The thickness of the frame 12 reduces from the outside region toward the inside surface of the frame 12. The thicknesses of the connecting portions 15a and 15b may be equal to that of the piezoelectric vibrating portion 11. The connecting portions 15a and 15b may also be formed in such a manner that the upper and the lower surfaces are slanted so as to gradually increase the thickness from the piezoelectric vibrating portion 11 toward the frame 12. The piezoelectric vibrating portion 11 is positioned at the center in the up-and-down direction of the frame 12. Such shape provides a cavity between the upper substrate 20 and the lower substrate 30, allowing the piezoelectric vibrating portion 11 to vibrate.

The inside surface of the frame 12 connects the upper and lower surfaces of the frame 12 and has a first slanted surface 17a and a second slanted surface 17b. The first slanted surface 17a makes an interior angle $\theta_1$, equal to or greater than 90 degrees, with respect to the upper surface of the frame 12. The second slanted surface 17b makes an interior angle $\theta_2$, equal to or greater than 90 degrees, with respect to the lower surface of the frame 12. The first slanted surface 17a and the second slanted surface 17b may be provided in two steps in the up-and-down direction as shown in FIG. 2A.

The frame 12 also has a first recess 18a and a second recess 18b, which are disposed to the lower surface of the frame 12 and communicate from the inside to the outside of the frame 12. The first recess 18a and the second recess 18b are disposed at positions on the frame 12 so as to face each other across the piezoelectric vibrating portion 11. That is, the second recess 18b is disposed at a side adjacent to the connecting portion 15a while the first recess 18a is disposed at a position facing the second recess 18b across the piezoelectric vibrating region 11 on the fame 12.

The piezoelectric vibrating portion 11 is made of a piezoelectric material such as quartz crystal, lithium tantalite, and lithium niobate. The piezoelectric vibrating portion 11, the connecting portions 15a and 15b, and the frame 12 are preferably made of a quartz crystal substrate. For example, an AT cut quartz crystal substrate made by being cut from a quartz crystal material in such a manner that the substrate surface is in parallel with the X-axis and makes an angle with respect to the Z-axis of the quartz crystal.

The first exciting electrode 13 is disposed on the upper surface of the intermediate substrate 10 so as to make contact with the piezoelectric vibrating portion 11 while the second exciting electrode 14 is disposed on the lower surface of the intermediate substrate 10 so as to make contact with the piezoelectric vibrating portion 11. The first exciting electrode 13 extends on the piezoelectric vibrating portion 11 from the first wiring line 23 disposed on the connecting portion 15a. The second exciting electrode 14 extends on the lower surface of the piezoelectric vibrating portion 11 from the second wiring line 33 disposed on the lower surface of the connecting portion 15b.

The first wiring line 23 extends from on the connecting portion 15a to on the first slanted surface 17a of the inside surface of the frame 12. The first wiring line 23 is disposed on the first slanted surface 17a so as to compass the periphery of the piezoelectric vibrating portion 11. The first wiring line 23 further extends on the second slanted surface 17b to reach the inside of the first recess 18a. The second slanted surface 17b is disposed at a side opposite to a side at which the connecting portion 15a is provided.

The second wiring line 33 extends from the lower surface of the connecting portion 15b to on the second slanted surface 17b of the inside surface of the frame 12. The second wiring line 33 further extends from on the second slanted surface 17b to the inside of the second recess 18b disposed at a side adjacent to the connecting portion 15b.

The first exciting electrode 13, the second exciting electrode 14, the first wiring line 23, and the second wiring line 33 are formed in a multilayer structure composed of a chromium (Cr) film as an underlayer and a gold (An) film on the Cr film, for example.

1.2 Whole Structure

FIG. 3 is a sectional view of the piezoelectric device according to the embodiment of the invention. The material of the upper substrate 20 and the lower substrate 30 is not particularly limited as long as it has insulation property. The material is preferably the same of the intermediate substrate taking into consideration a thermal expansion difference of materials. For example, quartz crystal is used.

The lower substrate 30 has a first groove 25 disposed below the first recess 18a and a second groove 26 disposed below the second recess 18b. The first groove 25 and the second groove 26 have a semicircular or an arced shape in plan view and pass through from the upper surface to the lower surface of the lower substrate 30. The lower substrate 30 has a first external terminal 32 and a second external terminal 34 on its lower surface. The first external terminal 32 is disposed in a region surrounding the first groove 25. The second external terminal 34 is disposed in a region surrounding the second groove 26.

The piezoelectric device 100 further includes a third wiring line 35 electrically connecting the first wiring line 23 and the first external terminal 32 and a fourth wiring line 36 electrically connecting the second wiring line 33 and the second external terminal 34. The third wiring line 35 and the fourth wiring line 36 are made of a conductive material such as solder.

The first external terminal 32 and the second external terminal 34 are used for electrically connecting the piezoelectric device 100 to external apparatuses. The first external terminal 32 and the second external terminal 34 are disposed apart from each other. Specifically, they are respectively disposed at ends facing each other in the longitudinal direction of the lower substrate 20. The first external terminal 32 and the second external terminal 34 are formed in a multilayer structure composed of a Cr film as an underlayer and an Au film on the Cr film, for example.

In the piezoelectric device 100 of the embodiment, the first wiring line 23 extends on the first slanted surface 17a of the inside surface of the frame 12 and the first recess 18a to reach the outside surface of the piezoelectric device 100. This structure can easily downsize the piezoelectric device 100 and enlarge the area of the piezoelectric vibrating portion as compared with a case where the first wiring line reaches the outside surface of the frame through a through hole. As a result, a crystal impedance (CI) value can be lowered.

In the piezoelectric device 100 of the embodiment, the first wiring line 23 serving as a connecting electrode extends on the first slanted surface 17a and the second slanted surface 17b both of which face the X-axis direction so as to extend from the upper surface side to the lower surface side of the intermediate substrate 12. As shown in FIG. 2, the surfaces facing the X-axis direction form a vertex angle larger (more gently-inclined) than that is formed by the surfaces facing the Z'-axis direction. The vertex angle is an angle formed by the first slanted surface 17a and the second slanted surface 17b. Accordingly, the frequency of disconnection can be reduced as compared with a case where a wiring line (connecting electrode) extends from the upper surface side to the lower surface side of the intermediate substrate using the surfaces facing the Z'-axis direction.

The slanted surface 17a is formed in two steps on which the first wiring line 23 is formed. This structure makes it possible to form the first wiring line 23 with a wide width. As a result, the increase of CI value can be prevented.

2. Method for Manufacturing a Piezoelectric Device

A method for manufacturing the piezoelectric device 100 of the embodiment will be described. FIGS. 4 to 10 are diagrams showing the method for manufacturing the semiconductor device 100 of the embodiment.

Figure 6:
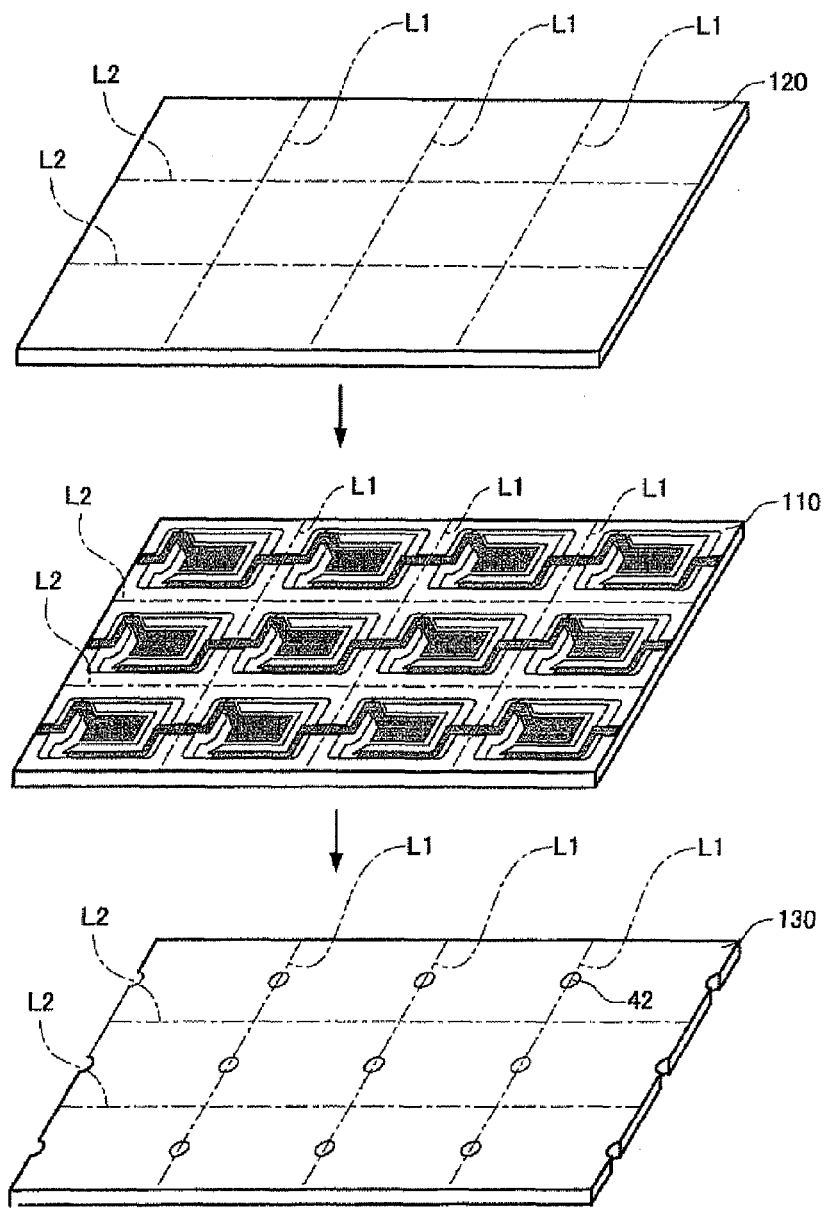
FIG. 6 is a view to explain a method for manufacturing the piezoelectric device of the embodiment.

(1) First, an upper quartz crystal plate 120 (upper substrate), an intermediate quartz crystal plate 110 (intermediate substrate), and a lower quartz crystal plate 130 (lower substrate) are prepared (refer to FIG. 6). The upper quartz crystal plate 120 includes a plurality of upper substrates 20. The intermediate quartz crystal plate 110 includes a plurality of intermediate substrates 10. The lower quartz crystal plate 130 includes a plurality of lower substrates 30.

Figure 4:
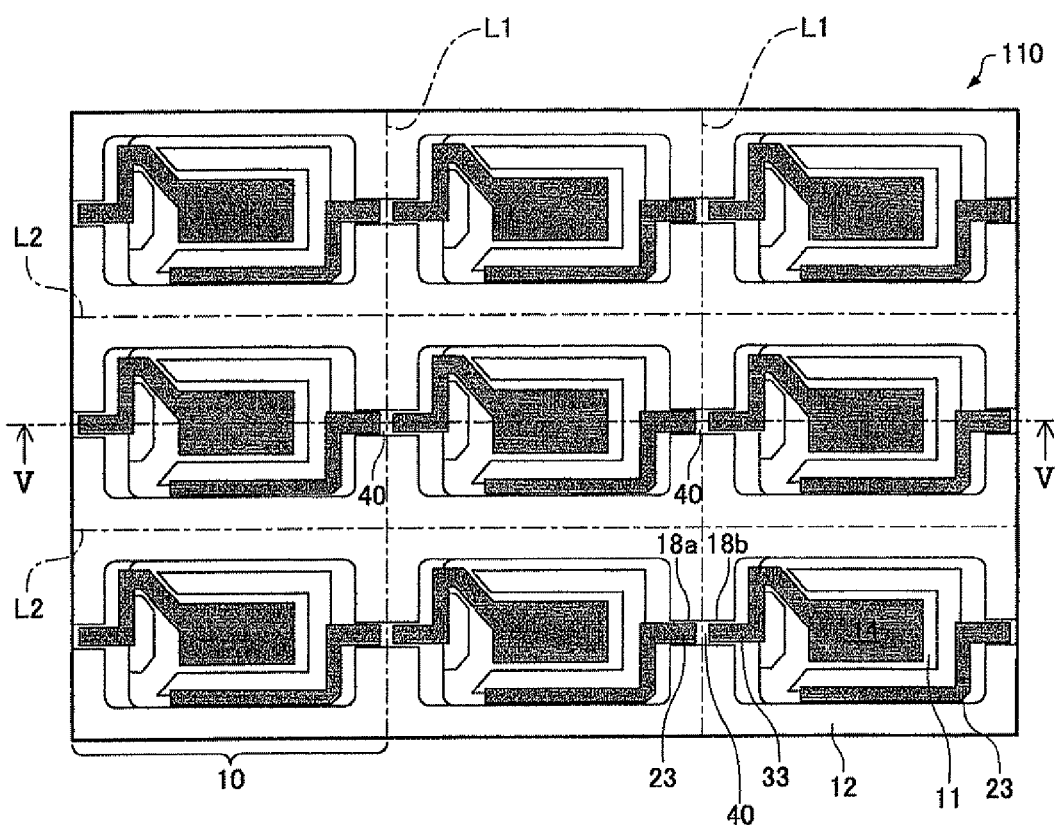
FIG. 4 is a view to explain a method for manufacturing the piezoelectric device of the embodiment.

FIG. 4 is a bottom view of the intermediate quartz crystal plate 110 of the embodiment. The intermediate quartz crystal plate 110 includes a plurality of piezoelectric vibrating portions 11, a plurality of connecting portions 15a and 15b, a plurality of first exciting electrodes 13, a plurality of second exciting electrodes 14, a plurality of first recesses 18a, and a plurality of second recesses 18b. The frame 12 surrounds each piezoelectric vibrating portion 11. The frame 12, which is integrated, is provided with cutting lines L1 and L2 on its surface. The cutting lines L1 and L2 are intersected at a right angle.

The first recess 18a and the second recess 18b both of which are adjacent each other across the cutting line L1 may communicate as shown in FIG. 4. The cutting line L1 is disposed in a communication portion 40 of the first recess 18a and the second recess 18b.

The first wiring line 23 provided to the first recess 18a and the second wiring line 33 provided to the second recess 18b are disposed so as not to be contacted with each other, and are not disposed at least on the cutting line L1.

An example of a making method of the intermediate quartz crystal plate 110 will be described.

First, a quartz crystal plate is prepared. Then, a first step of each of the first slanted surface 17a and the second slanted surface 17b is formed. Subsequently, a second step of each of the first slanted surface 17a and the second slanted surface 17b, and the first recess 18a and the second recess 18b are formed. The processes are carried out by wet-etching, for example. A thin plate portion and a thick plate portion are formed simultaneously in forming the first slanted surface 17a and the second slanted surface 17b. The thin plate portion and the thick plate portion become the piezoelectric vibrating portion 11 and the frame 12 respectively in later process.

Then, the slits 16a and 16b are formed so as to provide the piezoelectric vibrating portion 11 and the frame 12. This process is carried out by wet-etching with a photolithographic technique, for example.

Next, the first exciting electrode 13, the second exciting electrode 14, the first wiring line 23, and the second wiring line 33 are provided by etching with a photolithographic technique, vapor deposition, sputtering and the like. The first wiring line 23 is disposed on the surface of the first slanted surface 18a and the inside of the first recess 18a. The second wiring line 33 is disposed on the surface of the second slanted surface 18b and the inside of the second recess 18b.

Figure 5:
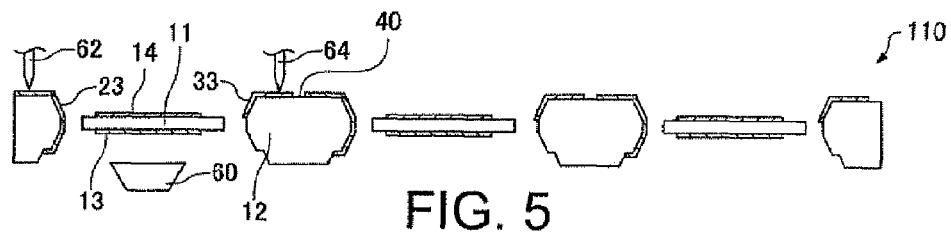
FIG. 5 is a view to explain a method for manufacturing the piezoelectric device of the embodiment.

Then, each frequency of the piezoelectric vibrating portions 11 is adjusted (refer to FIG. 5). FIG. 5 is a view to explain the frequency adjustment and includes a sectional view taken along the line V-V of the intermediate quartz crystal plate 110 shown in FIG. 4. FIG. 4 shows the lower surface of the intermediate quartz crystal plate 110. The frequency adjustment is carried out by changing the thickness of the first exciting electrode 13 or the second exciting electrode 14 while detecting frequency by vibrating the piezoelectric vibrating portion 11. Specifically, a probe 62 is contacted with the first wiring line 23 inside the first groove 15a and a probe 64 is contacted with the second wiring line 33 inside the second groove 18b so as to vibrate the piezoelectric vibrating portion 11. Based on the frequency detected, the thickness of the first exciting electrode 13 is reduced, for example. The thickness of the first exciting electrode 13 is reduced by using known methods. For example, the thickness is reduced by irradiating an argon plasma 60 onto the surface of the first exciting electrode 13. Alternatively, as a frequency adjustment method, the thickness of the first exciting electrode 13 may be increased by vapor deposition, for example.

The intermediate quartz crystal plate 110 can be made by the processes described above.

The lower quartz crystal plate 130 has a plurality of through holes 42 (refer to FIG. 6). The through holes 42 are disposed on the cutting line L1 of the lower quartz crystal plate 130. The position of the through hole 42 overlaps with the end portion of the communication portion 40 of the first wiring line 23 and the second wiring line 33. The through hole 42 may have a circular shape in plan view, and the radius is preferably increased in the thickness direction (toward a lower direction). The through hole 42 is cut along the cutting line L1 later so as to be separated into the first groove 25 and the second groove 26.

Figure 7:
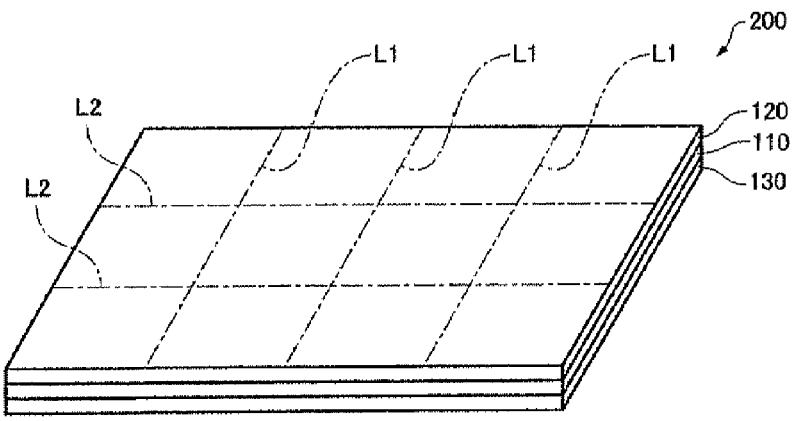
FIG. 7 is a view to explain a method for manufacturing the piezoelectric device of the embodiment.
Figure 8:
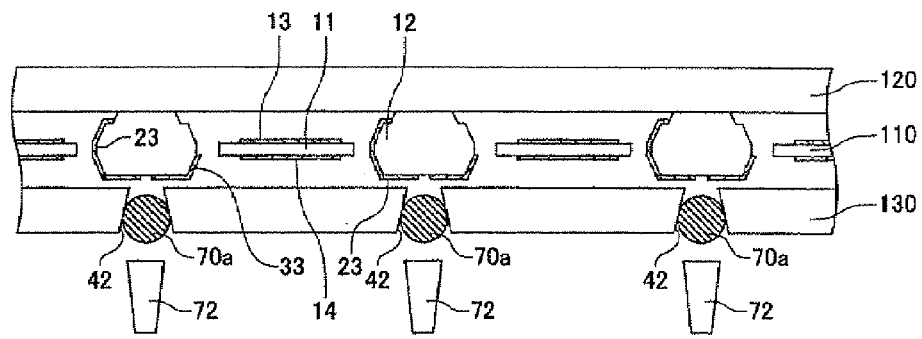
FIG. 8 is a view to explain a method for manufacturing the piezoelectric device of the embodiment.

(2) Next, the upper quartz crystal plate 120, the lower quartz crystal plate 130, and the intermediate quartz crystal plate 110 are bonded (refer to FIGS. 6 and 7). They are preferably bonded by applying a direct bonding manner. At last one of the bonding area of two quartz crystal plates to be bonded is irradiated with plasma so as to be activated. Then, two plates (substrates) are bonded. This bonding can reduce the occurrence of stress due to heating, stabilizing the frequency. In bonding, the center of the through hole 42 and the center of the communication portion 40 are aligned so that the both centers are overlapped.

(3) Next, a conductive material is plugged into the through hole 42 from a lower direction so as to form a conductive layer 70. Specifically, a metal ball 70a is disposed inside the through hole 42 (refer to FIG. 8). The metal ball 70a is, for example, a sphere body made of a conductive material such as solder and AuGe. The metal ball 70a has a diameter larger than at least the diameter of the through hole 42 at the upper surface. After the metal ball 70a is set in the through hole 42, a laser light 72 is irradiated so as to melt the metal ball 70a to form the conductive layer 70. As a result, the through hole 42 is sealed (refer to FIG. 9). Melting the metal ball 70a is not limited to laser light irradiation. For example, a high temperature furnace may be used.

Figure 10:
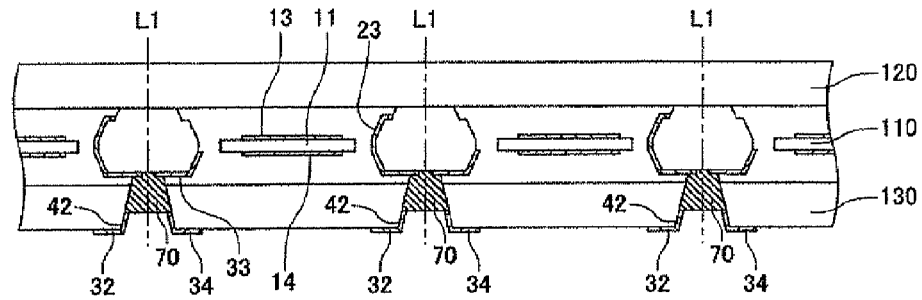
FIG. 10 is a view to explain a method for manufacturing the piezoelectric device of the embodiment.

Then, the first external terminal 32 and the second external terminal 34 are disposed so as to make contact with the conductive layer 70 (refer to FIG. 10). The first external terminal 32 and the second external terminal 34, both of which are adjacent across the cutting line L1, may be continuously formed.

Figure 9:
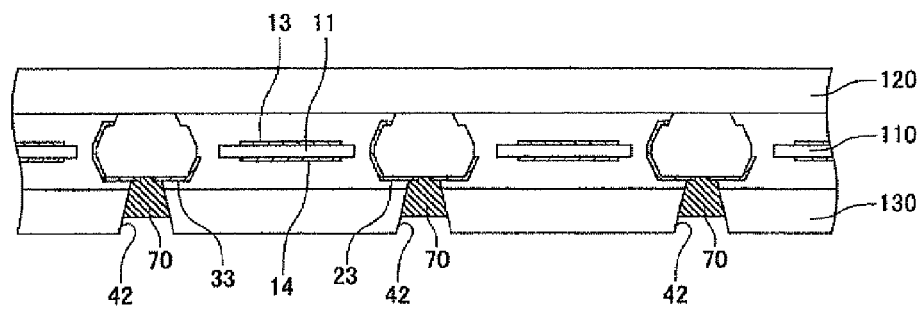
FIG. 9 is a view to explain a method for manufacturing the piezoelectric device of the embodiment.

As a result, a piezoelectric quartz crystal device (piezoelectric device) 300 can be provided that is composed of three quartz crystal plates and has a plurality of piezoelectric vibrating portions, as shown in FIG. 9.

(4) Then, the piezoelectric quartz crystal device 300 is cut along the cutting lines L1 and L2 so as to be separated.

Through the processes described above, the piezoelectric device 100 can be achieved (refer to FIG. 3).

In the method for manufacturing the piezoelectric device 100 of the embodiment, the probe 62 is contacted with the first wiring line 23 inside the first recess 18a and the probe 64 is contacted with the second wiring line 33 inside the second recess 18b in adjusting the frequency of the piezoelectric vibrating portion 11 (refer to FIG. 5). In this way, the probe contact can be done on the same planes enabling the structure of the probes 62 and 64 to be simplified.

In the method for manufacturing the piezoelectric device 100 of the embodiment, the conductive layer 70 provided to the through hole 42 is cut in the cutting and separation process. This process can provide a third wiring line 35 and a fourth wiring line 36 at the same time, reducing the number of processes. The third wiring line 35 electrically connects the first wiring line 23 and the first external terminal 32. The fourth wiring line 36 electrically connects the second wiring line 33 and the second external terminal 34.

The present invention is not limited to the above-described embodiment, but various modifications thereof are possible. For example, a tuning fork resonator may be used as the piezoelectric vibrating portion The invention includes substantially the same structures as those described in the embodiment (e.g., structures with the same functions, ways, and results or structures with the same objects and results). In addition, the invention includes structures obtained by replacing a nonessential part of the structure described in the embodiment. Further, the invention includes structures offering the same advantageous effects or structures achieving the same objects as of the structure described in the embodiment. Still further, the invention includes structures obtained by adding related art with the structures described in the embodiment.

The entire disclosure of Japanese Patent Application No. 2007-232805, filed Sep. 7, 2007 is expressly incorporated by reference herein.

What is claimed is:

1. A piezoelectric device, comprising:
   a lower substrate;
   an upper substrate;
   an intermediate substrate sandwiched between the lower substrate and the upper substrate, the intermediate substrate including:
      a piezoelectric vibrating portion;
      a frame surrounding a periphery of the piezoelectric vibrating portion;
      a connecting portion coupling the piezoelectric vibrating portion and the frame;
      a first exciting electrode disposed on an upper surface of the piezoelectric vibrating portion;
      a second exciting electrode disposed on a lower surface of the piezoelectric vibrating portion;
      a first wiring line electrically coupled to the first exciting electrode; and
      a second wiring line electrically coupled to the second exciting electrode; and
      an inside surface coupling an upper surface and a lower surface of the frame and having a slanted surface having an interior angle with respect to one of the upper surface and the lower surface, the angle being more than 90 degrees, one of the first wiring line and the second wiring line being disposed to a surface of the slanted surface.

2. The piezoelectric device according to claim 1, the frame having a first recess that is disposed to the lower surface and communicates from an inside to an outside of the frame, the first wiring line extending in the first recess.

3. The piezoelectric device according to claim 2, the frame having a second recess that is disposed to the lower surface so as to face the first recess and communicates from the inside to the outside of the frame, the second wiring line extending in the second recess.

4. The piezoelectric device according to claim 1, the first slanted surface being formed in two steps, the first wiring line being formed both to the steps of the slanted surface.

5. The piezoelectric device according to claim 1, the inside surface of the frame having a first slanted surface having a first interior angle with respect to the upper surface of the frame, the first interior angle being more than 90 degrees, and a second slanted surface having a second interior angle with respect to the lower surface of the frame, the second interior angle being more than 90 degrees, the first wiring line extending both to the first slanted surface and the second slanted surface.

* * * * *